United States Patent
Chao et al.

(10) Patent No.: US 11,315,991 B2
(45) Date of Patent: Apr. 26, 2022

(54) DISPLAY DEVICE COMPRISING A PIXEL DEFINING LAYER HAVING A PIXEL OPENING THAT DEFINES A LIGHT EMITTING REGION

(71) Applicant: INNOLUX CORPORATION, Jhu-Nan (TW)

(72) Inventors: Kuang-Pin Chao, Jhu-Nan (TW); Yun-Sheng Chen, Jhu-Nan (TW); Ming-Chien Sun, Jhu-Nan (TW)

(73) Assignee: INNOLUX CORPORATION, Chu-Nan (TW)

( * ) Notice: Subject to any disclaimer, the term of this patent is extended or adjusted under 35 U.S.C. 154(b) by 0 days.

(21) Appl. No.: 16/844,835

(22) Filed: Apr. 9, 2020

(65) Prior Publication Data

US 2020/0233273 A1    Jul. 23, 2020

Related U.S. Application Data

(60) Division of application No. 15/194,538, filed on Jun. 27, 2016, now Pat. No. 10,649,290, which is a
(Continued)

(30) Foreign Application Priority Data

May 7, 2014 (TW) .................. 103116212

(51) Int. Cl.
*H01L 27/32* (2006.01)
*H01L 27/12* (2006.01)
*G02F 1/1362* (2006.01)

(52) U.S. Cl.
CPC .... *H01L 27/3246* (2013.01); *G02F 1/136227* (2013.01); *G02F 1/136286* (2013.01);
(Continued)

(58) Field of Classification Search
CPC ............... H01L 27/1251; H01L 51/525; G02F 1/133371
See application file for complete search history.

(56) References Cited

U.S. PATENT DOCUMENTS

2007/0051952 A1* 3/2007 Yamazaki ............. G02F 1/1368
257/59
2011/0291116 A1* 12/2011 Kang .................. H01L 51/5253
257/88
(Continued)

*Primary Examiner* — Paul C Lee
(74) *Attorney, Agent, or Firm* — Liu & Liu

(57) ABSTRACT

A display device is disclosed, which comprises: a first substrate; a first metal layer disposed on a surface of the first substrate; a first insulating layer disposed on the first metal layer; a second insulating layer disposed on the first insulating layer; and a second metal layer covering a part of the second insulating layer and comprising a connecting region, wherein the first metal layer and the second metal layer are electrically connected to each other in the connecting region, wherein the second metal layer corresponding to the connecting region comprises a sidewall region and a non-sidewall region, a first thickness of the sidewall region corresponding to the second insulating layer along a direction parallel to the surface of the first substrate is smaller than a second thickness of the non-sidewall region along a direction perpendicular to the surface of the first substrate.

5 Claims, 8 Drawing Sheets

Related U.S. Application Data continuation of application No. 14/572,460, filed on Dec. 16, 2014, now Pat. No. 9,406,737.

(52) U.S. Cl.
CPC ........ *H01L 27/124* (2013.01); *H01L 27/1248* (2013.01); *H01L 27/3276* (2013.01); *H01L 2251/558* (2013.01)

(56) References Cited

U.S. PATENT DOCUMENTS

| | | | |
|---|---|---|---|
| 2012/0001191 A1* | 1/2012 | Ma | G02F 1/136213 257/71 |
| 2012/0056179 A1* | 3/2012 | Lee | H01L 31/1055 257/53 |
| 2014/0346477 A1* | 11/2014 | Chao | H01L 27/322 257/40 |
| 2016/0307923 A1 | 10/2016 | Chao et al. | |

\* cited by examiner

DISPLAY DEVICE COMPRISING A PIXEL DEFINING LAYER HAVING A PIXEL OPENING THAT DEFINES A LIGHT EMITTING REGION

CROSS REFERENCE TO RELATED APPLICATION

This application is a divisional of U.S. patent application Ser. No. 15/194,538, filed Jun. 27, 2016; which is a continuation of U.S. patent application Ser. No. 14/572,460, filed Dec. 16, 2014; which claims the priority of Taiwan Patent Application Ser. No. 103116212, filed on May 7, 2014. The subject matter of these applications is incorporated herein by reference.

BACKGROUND OF THE INVENTION

1. Field of the Invention

The present invention relates to a display device and, more particularly, to a display device capable of decreasing resistance, reducing current leakage, improving capacity value and increasing storage capacity in pixels.

2. Description of Related Art

In recent years, all the display devices are developed toward having small volume, thin thickness and light weight as the display techniques progresses. Hence, a conventional cathode ray tube (CRT) display is gradually replaced by flat panel display devices such as a liquid crystal display (LCD) device and an organic light emitting diode (OLED) display device. The flat panel display devices can be applied to various fields. For example, the daily used devices such as cell phones, notebooks, video cameras, cameras, music players, navigation devices, and televisions are equipped with the flat panel display devices.

Although the LCD device and the OLED display device are commercially available and especially the techniques for the LCD device are much mature, every manufacturer is desired to develop display devices with improved display quality to meet customers' requirement as the display devices developed. In particular, the OLED display device is one important target for manufacturers.

Even though the LCD device and the OLED display device are well developed and commercialized, it is still necessary to develop a display device with improved display quality to meet the customers' requirement.

SUMMARY OF THE INVENTION

An object of the present invention is to provide a display panel to decrease resistance, reduce current leakage, improve capacity value and increase storage capacity in pixels.

To achieve the object, the present invention provides a display device, comprising: a first substrate; a first insulating layer disposed on the first substrate; a second insulating layer disposed on the first insulating layer; and a metal layer disposed on the second insulating layer and comprising plural conductive lines, wherein an opening region is located between two adjacent conductive lines to expose the second insulating layer, wherein a thickness of the second insulating layer under the metal layer is larger than that exposed from the opening region. More specifically, the metal layer of the present invention is a patterned metal layer, and the thickness of the second insulating layer under the conductive lines of the patterned metal layer is larger than that exposed from the opening region.

In other words, the present invention provides a display device, comprising: a first substrate; a first insulating layer disposed on the first substrate; a second insulating layer disposed on the first insulating layer; and a metal layer covering a part of the second insulating layer, wherein a thickness of the second insulating layer under the metal layer (i.e. covered with the metal layer) is larger than that uncovered with the metal layer.

In the display device of the present invention, the thickness of the second insulating layer covered with the metal layer is increased to achieve the purpose of decreasing resistance and reducing current leakage. Meanwhile, the thickness thereof uncovered with the metal layer and exposed from the opening region is decreased to achieve the purpose of improving capacity value and increasing storage capacity in pixels.

In the display panel of the present invention, the thickness of the second insulating layer exposed from the opening region (i.e. uncovered with the metal layer) is smaller than that under the metal layer (especially, the conductive lines of the metal layer). The thickness of the second insulating layer exposed from the opening region is preferably 10~95%, more preferably 20~80%, and most preferably 25%~35% of that under the conductive lines.

In addition, in the display panel of the present invention, the first insulating layer and the second insulating layer can be made of any dielectric material generally used in the art, such as silicon oxide and silicon nitride. Preferably, the first insulating layer is a silicon oxide layer; and/or the second insulating layer is a silicon nitride layer.

Furthermore, in the display panel of the present invention, an undercut is present in the first insulating layer under the second insulating layer. More specifically, the first insulating layer comprises a first side wall, the second insulating layer comprises a second side wall, and the second side wall is protruded beyond the first side wall.

In the display panel of the present invention, a sealant may be further disposed on the first substrate, and the thickness of the second insulating layer under the conductive lines of the patterned metal layer is larger than that under the sealant. Herein, the material for the sealant can be selected based on the types of the display panel. In one case that the display device of the present invention is a liquid crystal display (LCD) device, a frame sealant known in the art can be used as the sealant. In another case that the display device is an organic light emitting diode (OLED) display device, a fit sealant known in the art can be used as the sealant, which has excellent moisture barrier property and air impermeability.

The display device of the present invention can be applied as an OLED display device or a LCD device. In the case that the display device of the present invention is an OLED display device, the device may further comprise a planer layer disposed on the metal layer (especially, the conductive lines of the patterned metal layer) and in the opening region uncovered with the metal layer; additionally, the device may further comprise an organic light emitting diode unit, which comprises a first electrode, a second electrode and an organic light emitting layer disposed therebetween, wherein the metal layer (i.e. the conductive lines of the patterned metal layer) is electrically connected to the first electrode.

Furthermore, in the case that the display device of the present invention is a LCD device, the device may further comprise a liquid crystal display unit, which comprises a first electrode, a second electrode and a liquid crystal layer disposed therebetween, wherein the metal layer (i.e. the conductive lines of the patterned metal layer) is electrically connected to the first electrode.

Other objects, advantages, and novel features of the invention will become more apparent from the following detailed description when taken in conjunction with the accompanying drawings.

DETAILED DESCRIPTION OF THE PREFERRED EMBODIMENT

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

Embodiment 1

Figure 1:
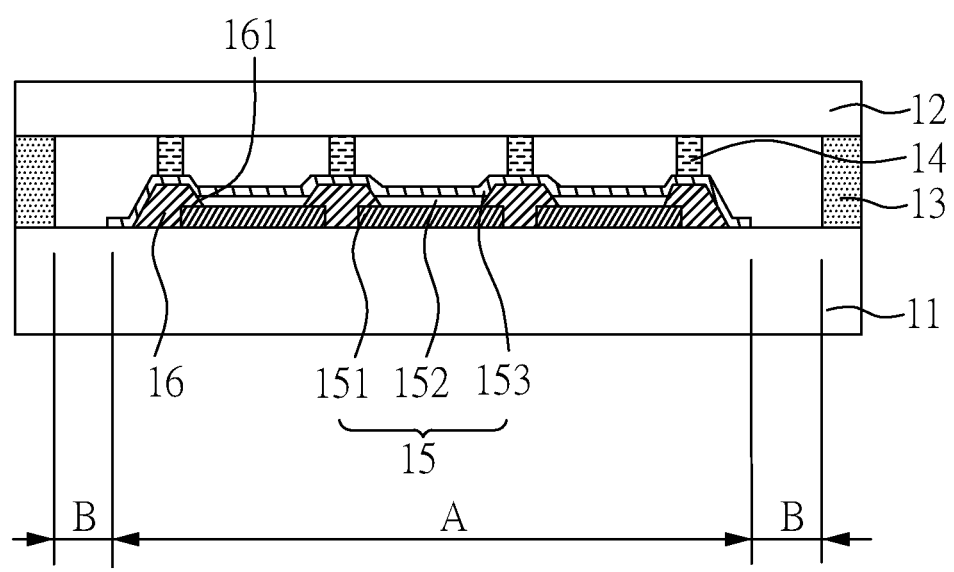
FIG. 1 is a cross-sectional view of an OLED display device according to Embodiment 1 of the present invention.

FIG. 1 is a cross-sectional view of an OLED display device of the present embodiment. During the process for manufacturing the OLED display device, a first substrate 11 and a second substrate 12 are firstly provided. Organic light emitting diode (OLED) units 15 and pixel defining layers 16 are disposed on the first substrate 11, wherein each pixel defining layer 16 is disposed between two adjacent OLED units 15. In addition, plural spacers 14 are disposed on the second substrate 12, and a sealant 13 (a frit sealant in the present embodiment) is formed on a periphery of the second substrate 12 in advance, which is formed through a dispensing process and a sintering process to fix on the second substrate 12. Then, the first substrate 11 is assembled with the second substrate 12, wherein the spacers 14 on the second substrate 12 correspond to regions outside the pixel opening 161 of the pixel defining layer 16. After the sealant 13 is adhered onto the first substrate 11 through a laser process, an OLED display device of the present embodiment is obtained.

In the present embodiment, both the first substrate 11 and the second substrate 12 are glass substrates. In addition, the OLED display device of the present embodiment comprises a display region A and a non-display region B, which is a region with circuits formed thereon. Furthermore, in the present embodiment, the OLED units 15 can respectively emit red, green and blue light; but the present invention is not limited thereto. For example, the OLED units 15 can be white OLED units, and a color filter unit (not shown in the figure) may be further disposed on the second substrate 12.

Figure 2:
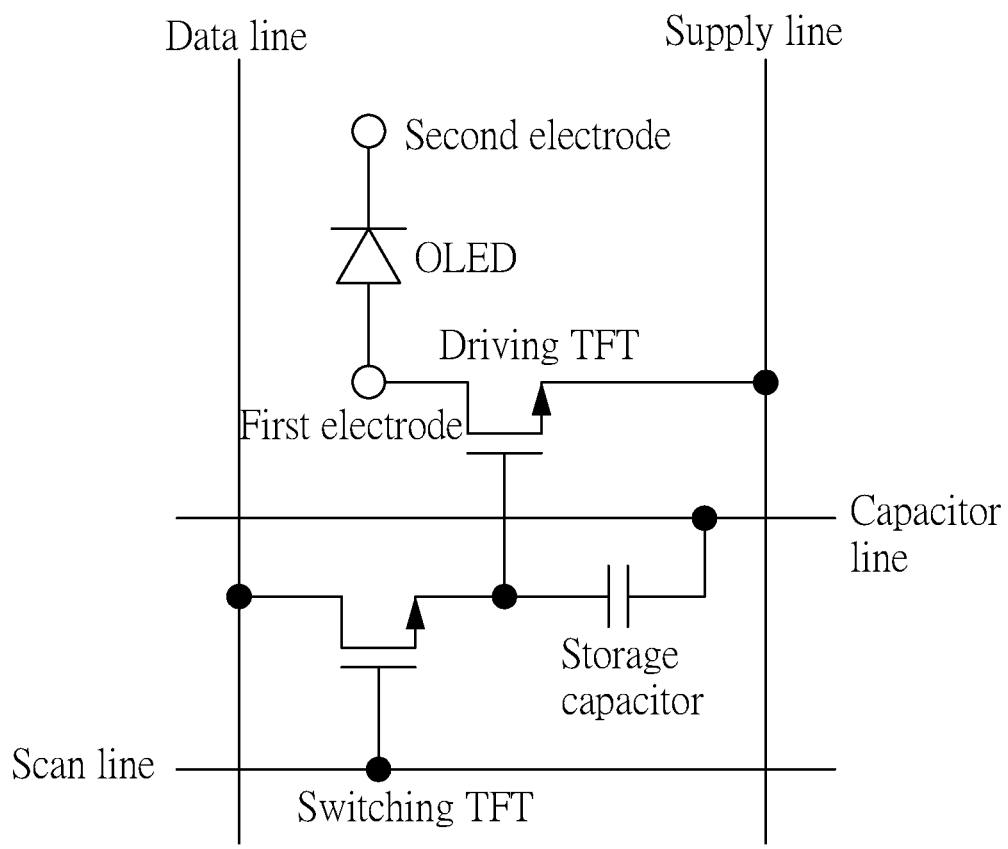
FIG. 2 is a perspective view showing a layout of an OLED display device according to Embodiment 1 of the present invention.

FIG. 2 is a perspective view showing a layout of an OLED display device of the present embodiment. As shown in FIG. 2, in the OLED display device of the present embodiment, each pixel unit respectively comprises: a scan line, a data line, a capacitor line, a supply line, a switching thin film transistor unit (shown as switching TFT in FIG. 2), a driving thin film transistor unit (shown as driving TFT in FIG. 2), a storage capacitor, and an OLED unit (shown as OLED in FIG. 2) connecting to a first electrode and a second electrode.

Figure 3:
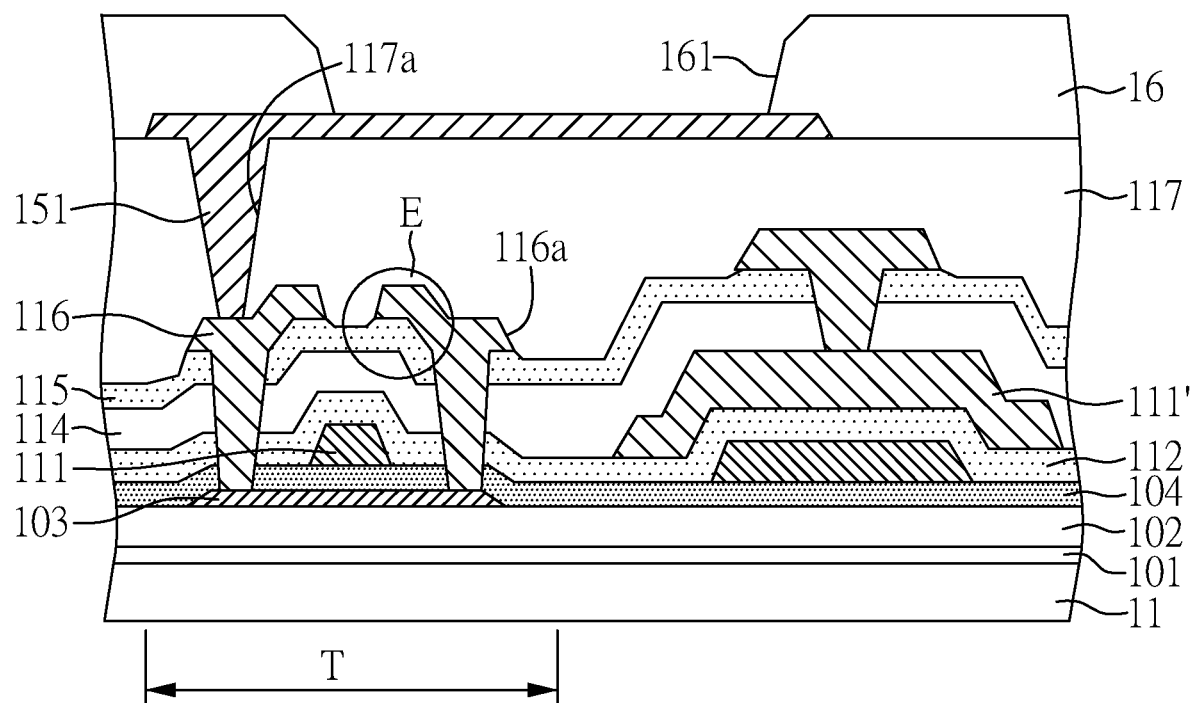
FIG. 3 is a cross-sectional view showing a part of a display region of an OLED display device according to Embodiment 1 of the present invention.

FIG. 3 is a cross-sectional view showing a part of a display region of an OLED display device of the present embodiment. As shown in FIGS. 1 and 3, the OLED display device of the present embodiment comprises: a first substrate 11 and a second substrate 12 opposite thereto. In the present embodiment, the thin film transistor (TFT) units used in the OLED display device are low temperature poly-silicon (LTPS) TFT units. As shown in FIG. 3, in the display region A, a first substrate 11 is firstly provided, and a silicon nitride buffer layer 101 and a silicon oxide buffer layer 102 are sequentially formed thereon. In the TFT unit region T, a poly-silicon layer 103 formed by annealing amorphous silicon with laser is further disposed on the silicon oxide buffer layer 102. Next, a silicon oxide insulating layer 104, a first metal layer 111, a gate insulating layer 112 and a Mo layer 111' are sequentially formed on the first substrate 11. Herein, the first metal layer 111 in the TFT unit region T is used as a gate electrode. The material for the gate insulating layer 112 can be any insulating material generally used in the art, such as silicon oxide. Next, a first insulating layer 114, a second insulating layer 115 and a second metal layer 116 are sequentially laminated on the gate insulating layer 112 and the Mo metal layer 111'. Herein, the second metal layer 116 in the TFT unit region T is further penetrated through the gate insulating layer 112, the first insulating layer 114 and the second insulating layer 115 to connect to the poly-silicon layer 103. Finally, a planer layer 117, a first electrode 151 and a pixel defining layer 16 are sequentially formed thereon, wherein the first electrode 151 locates not only on the planer layer 117 but also in a planer layer opening 117a thereof to electrically connect to the second metal layer 116, and the pixel defining layer 16 further has a pixel opening 161.

Herein, the first metal layer 111 and the second metal layer 116 are used as conductive lines. For example, as shown in FIG. 3, the first metal layer 111 is used as a gate electrode of the TFT unit, and the second metal layer 116 is used as a source and drain electrode of the TFT unit. The second metal layer 116 is a patterned metal layer with an opening region 116a to expose the second insulating layer 115 under the second metal layer 116. In addition, the gate electrode and the scan line formed by the first metal layer 111 electrically connect to each other, and the source and drain electrode and the data line formed by the second metal layer 116 also electrically connect to each other. In the present embodiment, the material for the first metal layer 111 and the second metal layer 116 can be any conductive material generally used in the art, such as metal, alloy, metal oxide, metal oxynitride, or other electrode materials generally used in the art; and preferably is metal. In the present embodiment, the first metal layer 111 is made of Mo, and the second metal layer 116 is a composite metal layer with a Ti layer, an Al layer and another Ti layer sequentially laminated from a side facing to the first substrate 11.

Figure 4A:
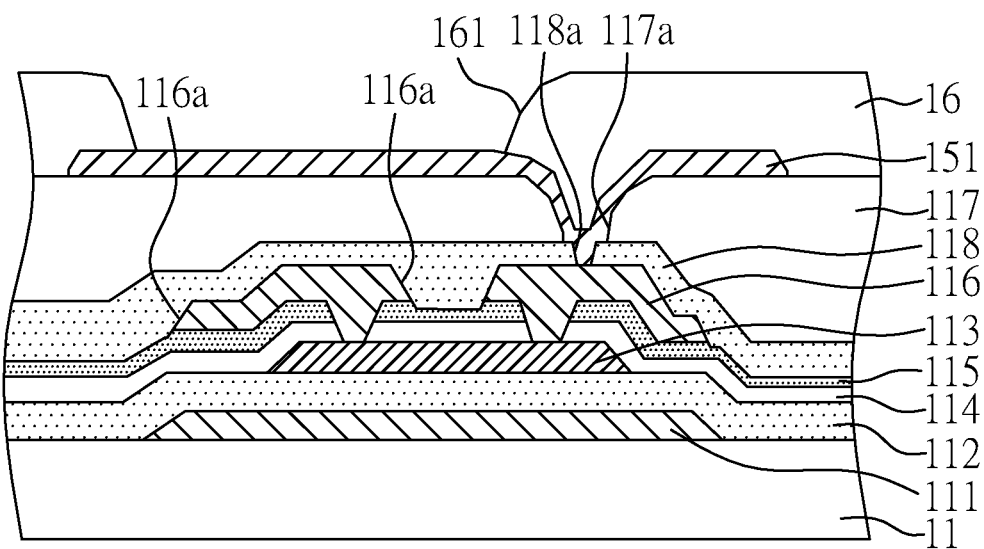
FIGS. 4A and 4B are respectively cross-sectional views showing parts of an OLED display device according to Embodiment 1 of the present invention.
Figure 4B:
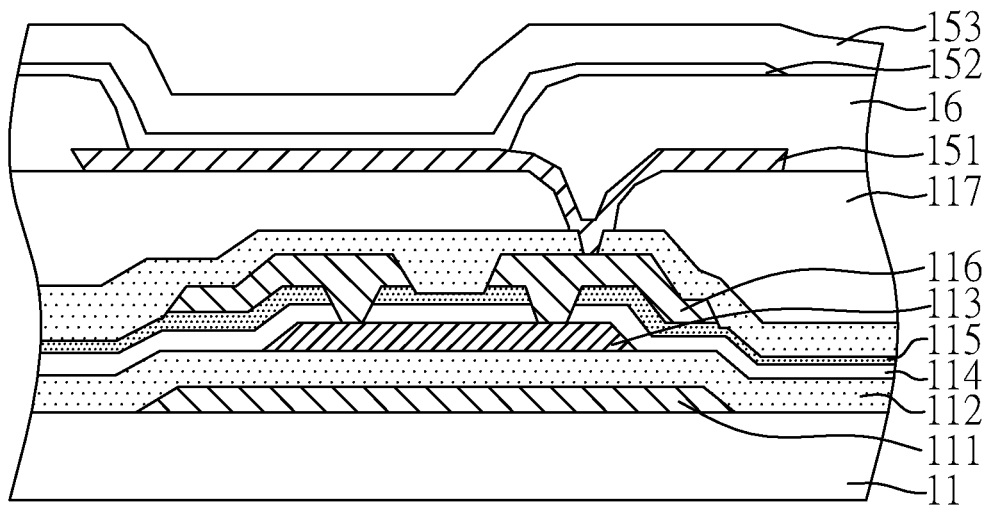

Not only the LTPS TFT units shown in FIG. 3 but also IGZO TFT units can be used in the OLED display device of the present embodiment. FIGS. 4A and 4B are respectively cross-sectional views showing TFT unit regions of the OLED display device of the present embodiment. As shown in FIG. 4A, a first metal layer 111, a gate insulating layer 112, a semiconductor layer 113, a first insulating layer 114, a second insulating layer 115 and a second metal layer 116 are sequentially laminated on the first substrate 11 to form a TFT unit, wherein the second metal layer 116 connects to the semiconductor layer 113. In addition, the semiconductor layer 113 is made of IGZO, and the materials for the first metal layer 111 and the second metal layer 116 are the same as those illustrated above. Next, a protection layer 118 with a protection layer opening 118a is laminated on the second metal layer 116 and in an opening region 116a thereof, and then a planer layer 117 with a planer layer opening 117a is further laminated on the protection layer 118. Herein, the second metal layer 116 is exposed from the protection layer opening 118a and the planer layer opening 117a.

Next, as shown in FIG. 4A, a first electrode 151 is formed on the planer layer 117 and in the planer layer opening 117a thereof, and a pixel defining layer 16 with a pixel opening 161 is sequentially formed on the first electrode 151. Then, as shown in FIG. 4B, an organic light emitting layer 152 and a second electrode 153 are sequentially laminated on the first electrode 151 and the pixel defining layer 16 and in the pixel opening 161 thereof, to obtain the OLED unit 15 (as shown in FIG. 1) of the present embodiment. Hence, as shown in FIGS. 1 and 4B, the OLED unit 15 of the present embodiment comprises: the first electrode 151, a second electrode 153 and an organic light emitting layer 152 disposed therebetween, wherein the second metal layer 116 is electrically connected to the first electrode 151. In addition, as shown in FIGS. 4A and 4B, the pixel defining layer 16 locates between the first electrode 151 and the organic light emitting layer 152, and a light emitting region is defined by the pixel opening 161 of the pixel defining layer 16.

For either the LTPS TFT unit shown in FIG. 3 or the IGZO TFT unit shown in FIGS. 4A and 4B, the first insulating layer 114 and the second insulating layer 115 can be made of any dielectric material generally used in the art, such as silicon oxide and silicon nitride. In the present embodiment the first insulating layer 114 is a silicon oxide layer, and the second insulating layer 115 is a silicon nitride layer.

For either the LTPS TFT unit shown in FIG. 3 or the IGZO TFT unit shown in FIGS. 4A and 4B, the first electrode 151 and the second electrode 153 can be a transparent electrode or a semi-transparent electrode known in the art. Herein, the transparent electrode can be a transparent conductive oxide (TCO) electrode, such as an ITO electrode and an IZO electrode; and the semi-transparent electrode can be a metal thin film electrode, such as an Mg/Ag alloy thin film electrode, an Au thin film electrode, a Pt thin film electrode and an Al thin film electrode. In addition, at least one of the first electrode 151 and the second electrode 153 can be a composite electrode of a transparent electrode and a semi-transparent electrode such as a composite electrode of a TCO electrode and a Pt thin film electrode, if it is necessary. Herein, only the OLED unit comprising the first electrode 151, the organic light emitting layer 152 and the second electrode 153 are exemplified, but the present invention is not limited thereto. Other OLED unit generally used in the art can also be applied to the OLED display device of the present invention, for example, the OLED unit comprising an electron transporting layer, an electron injection layer, a hole transporting layer, a hole injection layer, and/or other layers capable of facilitating the combination of holes and electrons.

Figure 5:
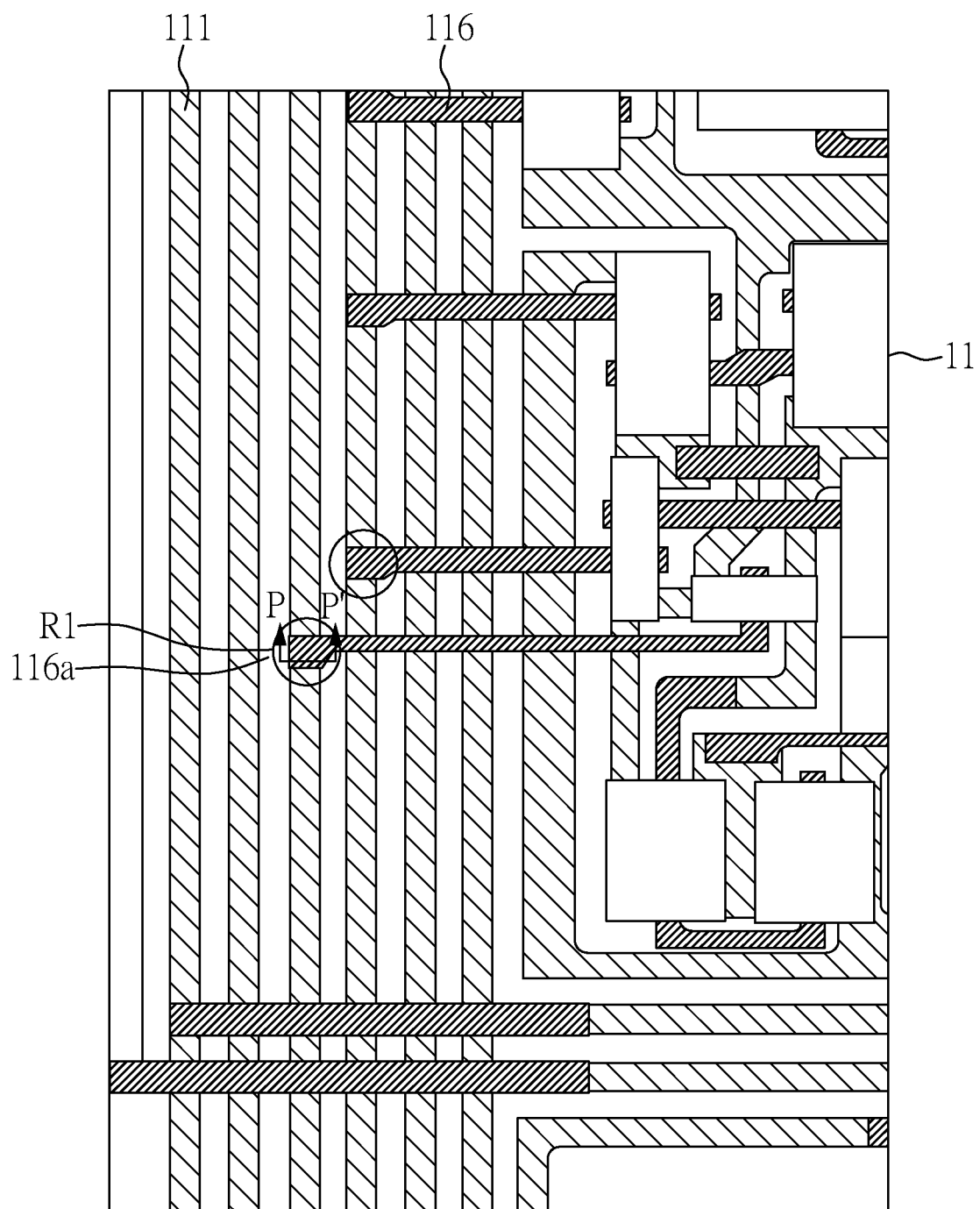
FIG. 5 is a perspective view showing a part of a non-display region of an OLED display device according to Embodiment 1 of the present invention.

FIG. 5 is a perspective view showing a part of a non-display region of the OLED display device of the present embodiment. As shown in FIGS. 1 and 5, in the non-display region, a first metal layer 111, a first insulating layer (not shown in the figure), a second insulating layer (not shown in the figure) and a second metal layer 116 are sequentially laminated on the first substrate 11, wherein the first metal layer 111 and the second metal layer 116 are used as conductive lines, and electrically connected to each other in a connecting region R1.

Figure 6:
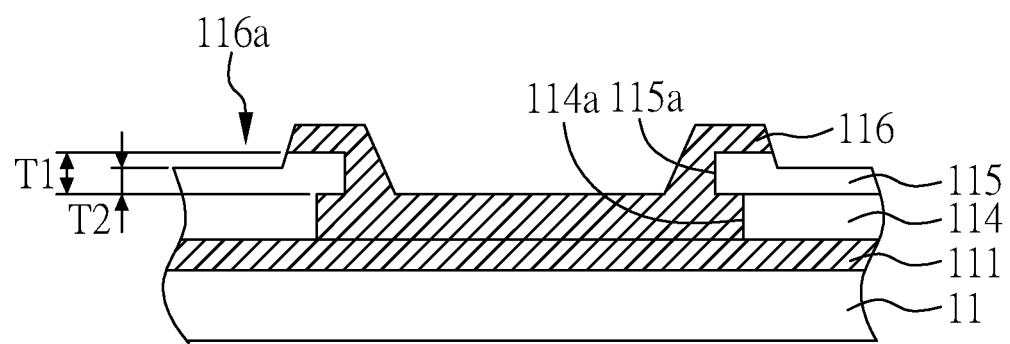
FIG. 6 is a cross-sectional view of an OLED display device along a P-P' line in FIG. 5 according to Embodiment 1 of the present invention.

FIG. 6 is a cross-sectional view of the OLED display device of the present embodiment along a P-P' line in FIG. 5. As shown in FIG. 6, the first metal layer 111 is disposed on the first substrate 11, the first insulating layer 114 is disposed on the first metal layer 111, the second insulating layer 115 is disposed on the first insulating layer 114, and the second metal layer 116 is disposed on the second insulating layer 115. Herein, the second metal layer 116 is a patterned metal layer and comprises conductive lines, and an opening region 116a is located between two adjacent conductive lines to expose the second insulating layer 115, as shown in FIGS. 5 and 6.

Figure 7:
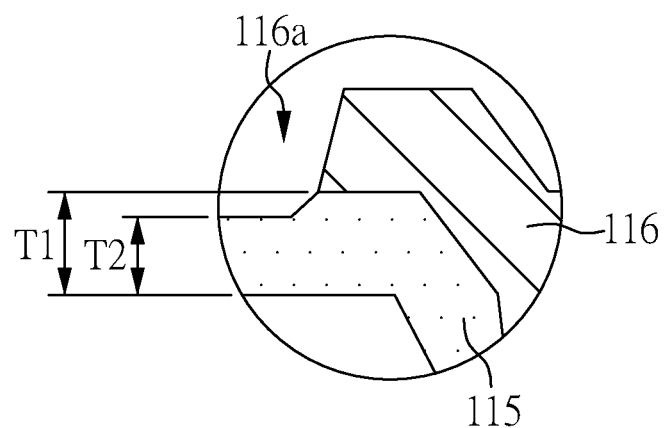
FIG. 7 is an enlarged view showing a region E of an OLED display device in FIG. 3 according to Embodiment 1 of the present invention.

FIG. 7 is an enlarged view of the OLED display device of the present embodiment showing the region E indicated in FIG. 3. As shown in FIG. 7, a thickness T1 of the second insulating layer 115 covered with the second metal layer 116 (i.e. the second insulating layer 115 under the conductive lines of the second metal layer 116) is larger than a thickness T2 thereof exposed from the opening region 116a (i.e. the second insulating layer 115 uncovered with of the second metal layer 116). Preferably, the thickness T2 of the second insulating layer 115 exposed from the opening region 116a is 10~95% of the thickness T1 thereof under the conductive lines of the second metal layer 116. More preferably, the thickness T2 is 20~80% of the thickness T1. Most preferably, the thickness T2 is 25~35% of the thickness T1. In the present embodiment, the thickness T2 is 70% less than the thickness T1, i.e. the thickness T2 is 30% of the thickness T1.

Herein, only a part of the OLED display device of the present embodiment is used to illustrate the thickness of the second insulating layer; and a person skilled in the art can understand that the same design for the thickness thereof is also applied onto other parts of the OLED display device.

Furthermore, as shown in FIG. 6, an undercut is present in the first insulating layer 114 under the second insulating layer 115. More specifically, the first insulating layer 114 comprises a first side wall 114a, the second insulating layer 115 comprises a second side wall 115a, and the second side wall 115a is protruded beyond the first side wall 114a.

Figure 8:
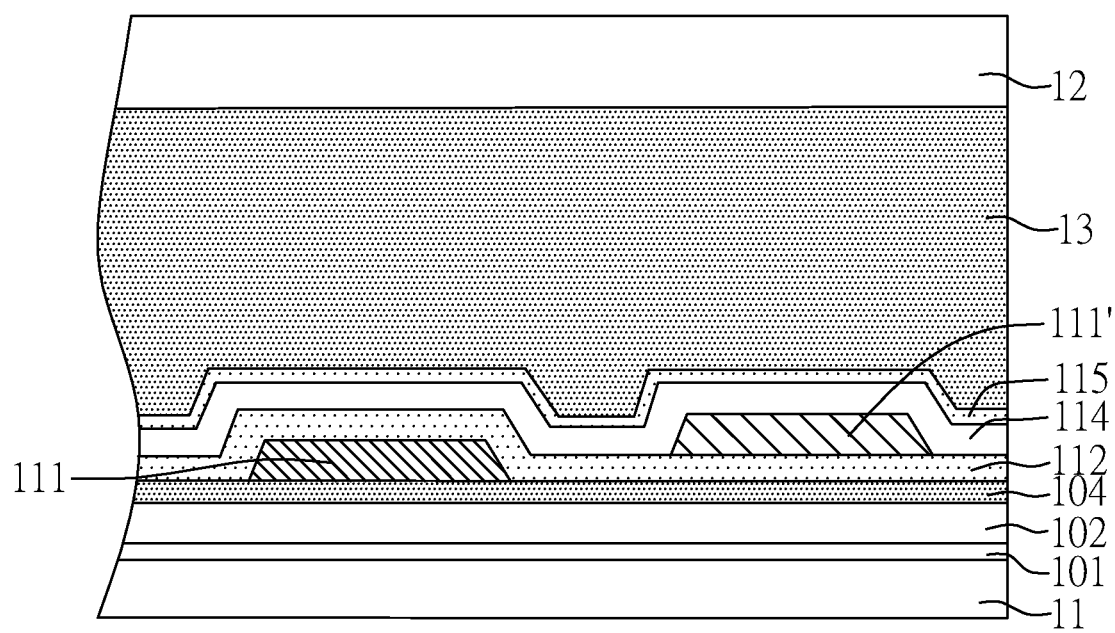
FIG. 8 is a cross-sectional view showing a sealant region of an OLED display device in FIG. 1 according to Embodiment 1 of the present invention.

FIG. 8 is a cross-sectional view showing a sealant region of the OLED display device in FIG. 1. In addition, as shown in FIGS. 1 and 8, a sealant 13 is further disposed on the first substrate 11. As shown in FIGS. 3, 4A, 4B and 8, the thickness of the second insulating layer 115 covered with the second metal layer 116 is larger than that under the sealant 13.

Embodiment 2

Figure 9:
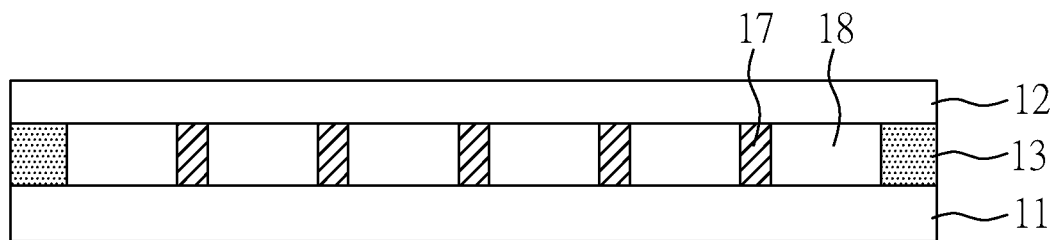
FIG. 9 is a cross-sectional view of a LCD device according to Embodiment 2 of the present invention.
Figure 10:
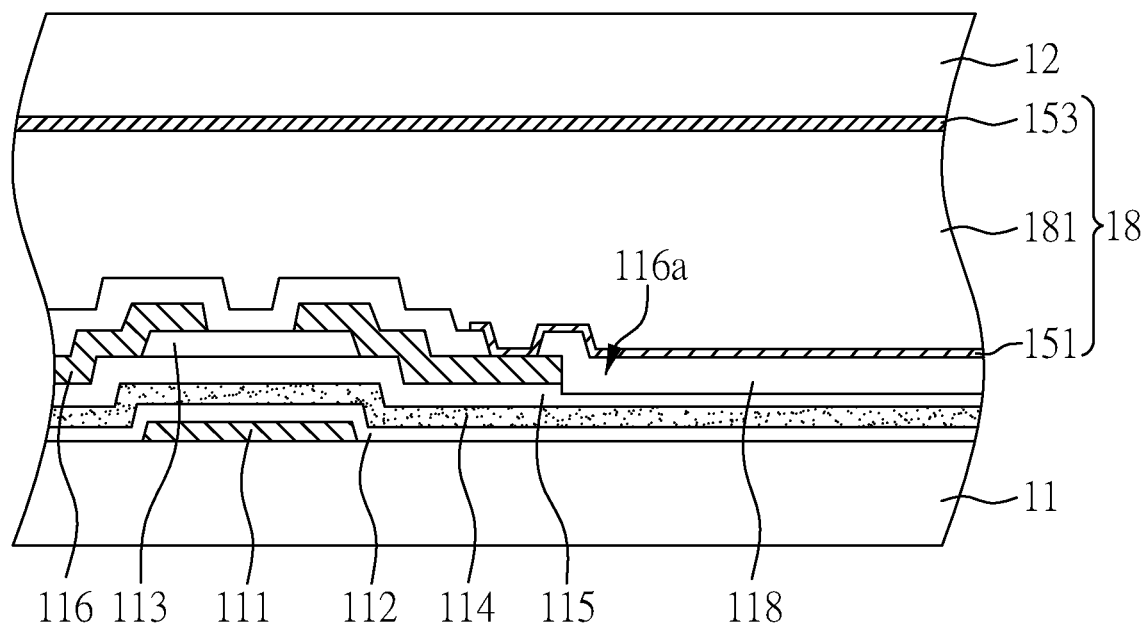
FIG. 10 is a cross-sectional view showing a part of a display region of a LCD device according to Embodiment 2 of the present invention.

FIG. 9 is a cross-sectional view of a LCD device of the present embodiment. During the process for manufacturing the LCD device, a first substrate 11 and a second substrate 12 are firstly provided, and different units are respectively disposed thereon (not shown in the figure). For example, in some embodiments, as shown in FIG. 10, TFT units are disposed on the first substrate 11, and color filter units are disposed on the second substrate 12 (wherein the color filter units are not shown in FIG. 10). In other embodiments, both the TFT units and the color filter units are disposed on the first substrate 11. In addition, one of the first substrate 11 and the second substrate 12 are disposed with plural spacers 17, and a sealant 13 (a frame sealant in the present embodiment) is formed on a periphery of the second substrate 12 in advance. After the second substrate 12 is assembled with the first substrate 11, a liquid crystal material is injected into the space between the first substrate 11 and the second substrate 12 through any known manner used in the art, such as a drop-type injection process or an injection method using a capillary effect, to form a liquid crystal layer 181 to obtain the LCD device of the present embodiment.

FIG. 10 is a cross-sectional view showing a part of a display region of the LCD device of the present embodiment. As shown in FIG. 10, in the present embodiment, a first metal layer 111, a gate insulating layer 112, a first insulating layer 114, a second insulating layer 115, a semiconductor layer 113 and a second metal layer 116 are sequentially laminated on the first substrate 11 to form a TFT unit. In addition, a protection layer 118 is laminated on the second metal layer 116 and in an opening region 116*a* thereof. A first electrode 151 is formed on the protection layer 118, which is electrically connected to the second metal layer 116. Herein, the material for the protection layer 118 can be any known material for the passivation layer such as silicon oxide. Furthermore, in the present embodiment, the thickness of the second insulating layer 115 related to the second metal layer 116 is the same as that illustrated in Embodiment 1, and not described herein.

In addition, as shown in FIG. 10, the LCD device of the present embodiment comprises: a liquid crystal display unit 18, which comprises the first electrode 151, a second electrode 153 and the liquid crystal layer 181 disposed therebetween, wherein the second metal layer 116 is electrically connected to the first electrode 151. Furthermore, in the present embodiment, the second electrode 153 is disposed on the second substrate 12, and a color filter unit (not shown in the figure) is further disposed on the second substrate 12.

Moreover, the LCD device of the present embodiment may further comprise a backlight module disposed under the first substrate 11 to provide an incident light to the liquid crystal layer 181.

In conclusion, in the display devices provided by the present invention, the thickness of the second insulating layer covered with the metal layer (which is the second metal layer illustrated in the aforementioned embodiments) to achieve the purpose of decreasing resistance and reducing current leakage. Meanwhile, the thickness thereof exposed from the opening region (which is the opening region without covering with the second metal layer illustrated in the aforementioned embodiments) is decreased to achieve the purpose of improving capacity value and increasing storage capacity in pixels. Therefore, the display quality of the display device can be improved to meet the customer's requirement for electronic products.

Furthermore, the display device provided by the present invention can be applied to any electronic device for displaying images, such as a mobile phone, a notebook, a camera, a video camera, a music player, a navigation system, or a television.

Although the present invention has been explained in relation to its preferred embodiment, it is to be understood that many other possible modifications and variations can be made without departing from the spirit and scope of the invention as hereinafter claimed.

What is claimed is:
1. A display device, comprising:
a first substrate;
a poly-silicon layer disposed on the first substrate;
a first metal layer disposed on the poly-silicon layer and comprising a gate electrode;
a first insulating layer disposed on the first metal layer;
a second insulating layer disposed on the first insulating layer, wherein the first insulating layer is disposed between the first metal layer and the second insulating layer;
a second metal layer covering a part of the second insulating layer;
a planar layer disposed on the second metal layer;
a pixel defining layer disposed on the planar layer and comprising a pixel opening, wherein the gate electrode and the pixel opening are at least partially overlapped, and a light emitting region is defined by the pixel opening;
a first electrode electrically connected to the second metal layer;
a second electrode; and
an organic light emitting layer disposed between the first electrode and the second electrode, wherein the pixel defining layer is disposed between the first electrode and the organic light emitting layer,
wherein a thickness of the second insulating layer under the second metal layer is larger than that uncovered with the second metal layer.
2. The display device as claimed in claim 1, wherein a thickness of the second insulating layer uncovered with the second metal layer is 10~95% of that under the second metal layer.
3. The display device as claimed in claim 1, wherein the first insulating layer comprises a first side wall, the second insulating layer comprises a second side wall, and at least a part of the second side wall is protruded beyond a part of the first side wall.
4. The display device as claimed in claim 1, wherein the display device is an organic light emitting diode display device or a liquid crystal display device.
5. The display device as claimed in claim 1, further comprising a third insulating layer disposed between the poly-silicon layer and the first metal layer.

* * * * *